(12) United States Patent
Ehlen et al.

(10) Patent No.: US 9,448,599 B2
(45) Date of Patent: Sep. 20, 2016

(54) HIGH-DENSITY STORAGE SERVER CHASSIS

(71) Applicant: Facebook, Inc., Menlo Park, CA (US)

(72) Inventors: Jon Brian Ehlen, Newark, CA (US); Madhusudan Krishnan Iyengar, Foster City, CA (US); Jason David Adrian, San Jose, CA (US)

(73) Assignee: FACEBOOK, INC., Menlo Park, CA (US)

( * ) Notice: Subject to any disclaimer, the term of this patent is extended or adjusted under 35 U.S.C. 154(b) by 243 days.

(21) Appl. No.: 14/248,947

(22) Filed: Apr. 9, 2014

(65) Prior Publication Data

US 2015/0293566 A1    Oct. 15, 2015

(51) Int. Cl.
*G06F 1/18* (2006.01)
*H05K 7/20* (2006.01)
*H05K 1/18* (2006.01)
*H05K 7/14* (2006.01)

(52) U.S. Cl.
CPC ............... *G06F 1/187* (2013.01); *H05K 1/184* (2013.01); *H05K 7/1489* (2013.01); *H05K 7/20718* (2013.01); *H05K 7/20736* (2013.01)

(58) Field of Classification Search
CPC .......... G06F 1/187; G06F 1/184; G06F 1/16; H05K 7/20736; H05K 7/20718; H05K 7/1489
USPC ........................................ 361/679.39, 679.37
See application file for complete search history.

(56) References Cited

U.S. PATENT DOCUMENTS

| | | | | |
|---|---|---|---|---|
| 6,480,380 B1* | 11/2002 | French | ...................... | G06F 1/20 312/223.1 |
| 7,145,776 B2* | 12/2006 | King, Jr. | ............... | G11B 33/127 361/679.39 |
| 7,864,521 B2* | 1/2011 | Chen | ...................... | G06F 1/187 211/26 |
| 8,072,745 B2* | 12/2011 | Chen | ...................... | G06F 1/187 312/223.1 |
| 8,770,681 B2* | 7/2014 | Hu | ....................... | A47B 96/025 312/223.2 |
| 9,030,814 B2* | 5/2015 | Tsai | ...................... | G11B 33/00 312/223.1 |
| 9,055,690 B2* | 6/2015 | Ross | ...................... | G06F 1/187 361/679.37 |

(Continued)

*Primary Examiner* — Hoa C Nguyen
*Assistant Examiner* — Keith Depew
(74) *Attorney, Agent, or Firm* — Perkins Coie LLP

(57) ABSTRACT

Technology is provided for a high-density storage server chassis. The storage server chassis comprises a frame and an opposed pair of support ledges disposed in the frame and positioned to support a storage device therebetween. The support ledges are disposed on corresponding partitions mounted in the frame. The support ledges include at least one protrusion positioned to space the storage device away from the support ledge thereby defining an air flow region between the storage device and the support ledge. The storage server chassis further comprises a retainer moveably attached to a corresponding partition and operative to retain a corresponding storage device in the frame, wherein the retainer is movable between an open position and a closed position.

19 Claims, 11 Drawing Sheets

(56) References Cited

U.S. PATENT DOCUMENTS

| | | | | |
|---|---|---|---|---|
| 2003/0210517 A1* | 11/2003 | Syring | G06F 1/187 | 361/679.33 |
| 2005/0207059 A1* | 9/2005 | Cochrane | G06F 1/184 | 360/97.19 |
| 2005/0219833 A1* | 10/2005 | Wu | G06F 1/184 | 361/829 |
| 2007/0297128 A1* | 12/2007 | Chen | G06F 1/187 | 361/679.31 |
| 2010/0149747 A1* | 6/2010 | Chen | G11B 33/123 | 361/679.33 |
| 2013/0127310 A1* | 5/2013 | Yu | G06F 1/187 | 312/223.2 |
| 2013/0301211 A1* | 11/2013 | Guo | G06F 1/16 | 361/679.38 |
| 2014/0071612 A1* | 3/2014 | Hou | G06F 1/187 | 361/679.37 |
| 2014/0085806 A1* | 3/2014 | Song | G06F 1/183 | 361/679.37 |
| 2014/0189891 A1* | 7/2014 | Wu | G06F 21/88 | 726/35 |
| 2014/0204525 A1* | 7/2014 | Pecone | H05K 13/00 | 361/679.33 |
| 2015/0003005 A1* | 1/2015 | Chen | G06F 1/187 | 361/679.33 |

* cited by examiner

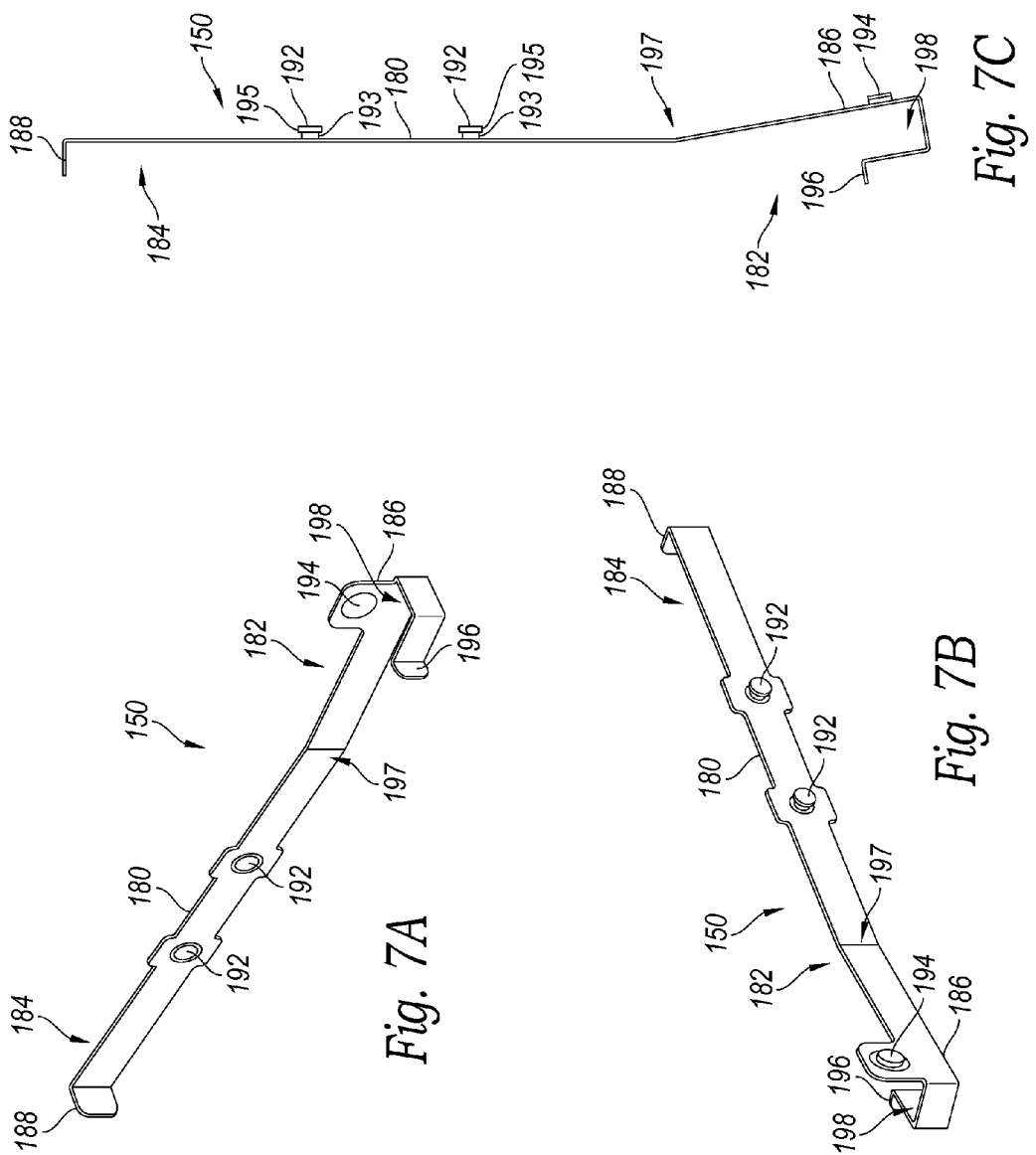

HIGH-DENSITY STORAGE SERVER CHASSIS

TECHNICAL FIELD

This patent application generally relates to data storage server configurations, and more specifically, to a high-density storage server chassis.

BACKGROUND

Capital and operating expenses for data centers have become an increasing part of IT organizations' budgets over time. Data centers are complex facilities including rows of data storage server racks. Each server rack has a footprint which consumes real estate, power, and cooling resources. With all the power, cooling, and cabling infrastructure, data centers are expensive facilities to operate. Thus, each server rack's footprint should be used efficiently in order to reduce costs and maximize profit. The more storage devices housed within a server rack, the more efficient the use of the footprint. However, server racks must be designed to provide adequate cooling to the storage devices, which becomes more difficult as the density of the storage devices increases. While existing rack designs are functional, there is still a need for higher density storage server designs that also provide adequate cooling to the storage devices.

BRIEF DESCRIPTION OF THE DRAWINGS

The high-density storage server chassis introduced here may be better understood by referring to the following Detailed Description in conjunction with the accompanying drawings, in which like reference numerals indicate identical or functionally similar elements:

FIG. 7A is a perspective view of a retainer, according to a representative embodiment, as viewed from the front.

FIG. 7B is a perspective view of the retainer shown in FIG. 7A as viewed from the back.

FIG. 7C is a top plan view of the retainer shown in FIGS. 7A and 7B.

Figure 1:
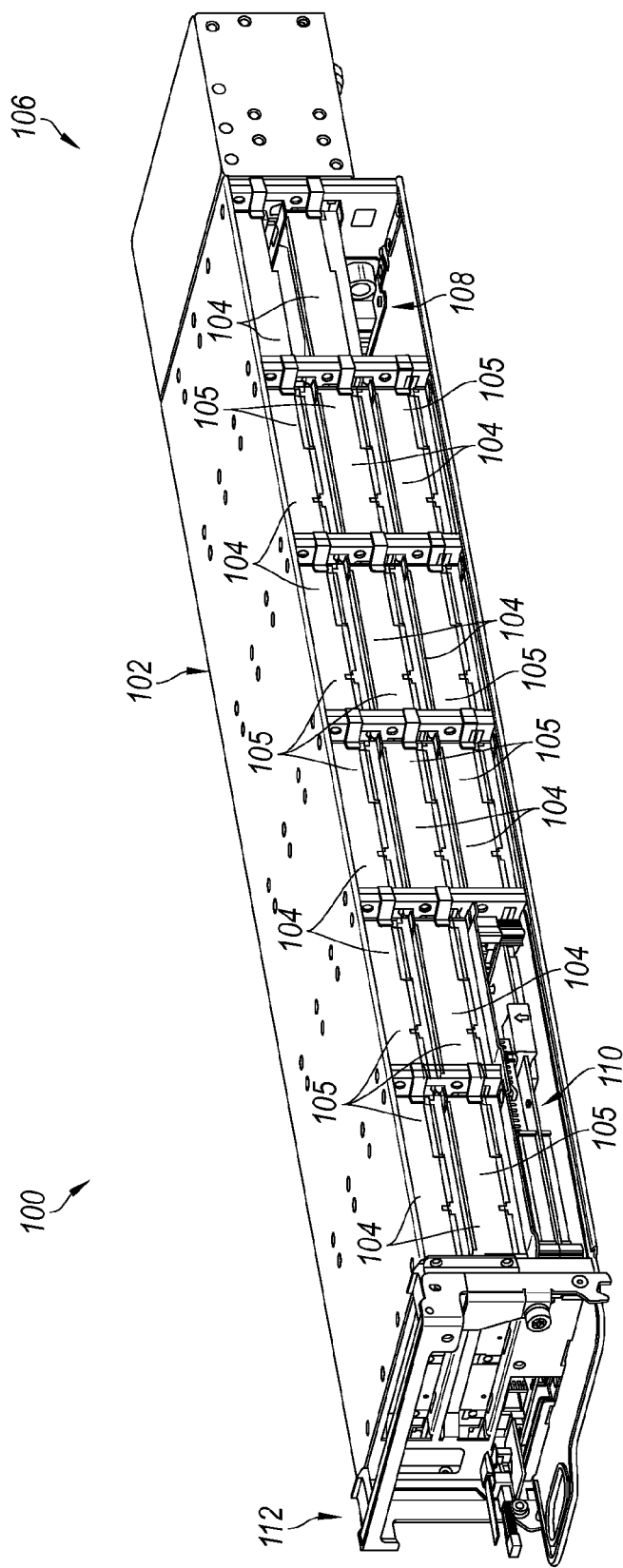
FIG. 1 is a perspective view of a data storage server module incorporating a high-density storage server chassis according to a representative embodiment of the present technology.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments as defined by the appended claims.

DETAILED DESCRIPTION

Overview

Technology is disclosed for a high-density storage server chassis ("the technology") that supports storage devices in a dense (i.e., closely spaced) configuration while allowing for adequate cooling to the storage devices. In various embodiments, the storage server chassis comprises a frame and at least one opposed pair of support ledges disposed in the frame and positioned to support a storage device therebetween. In various embodiments, selected support ledges include at least one protrusion positioned to space the storage device away from the support ledge, thereby defining an air flow region between the storage device and the support ledge. In some embodiments, the support ledges are disposed on corresponding sheet metal partitions and the protrusions are bridge lances formed in the sheet metal.

In various embodiments, the storage server chassis includes a retainer moveably attached to a corresponding partition and operative to retain a corresponding storage device in the frame, wherein the retainer is movable between an open position and a closed position. In various embodiments, the retainer includes an arm extending along the corresponding partition. A latch is disposed on a first end portion of the arm and a hook is disposed on a second end portion of the arm. The latch is configured to engage the partition and retain a corresponding storage device in the frame when the retainer is in the closed position. The hook is positioned to pull the storage device from the frame when the latch is disengaged and the retainer is moved from the closed position to the open position.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other obvious features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 illustrates a data storage server module 100 including a high-density storage server chassis 102 that houses a plurality of storage devices 104 (e.g., 3.5" hard drives). In some embodiments, the storage server chassis 102 can include a fan assembly 106 which draws air through the storage server chassis 102, thereby cooling the storage devices 104. Storage server chassis 102 can also include power connector 108 as well as a latch assembly 112 and a carrier assembly 110. As explained more fully below, each storage device 104 is housed and retained in a corresponding storage bay 105. It should be appreciated that the storage devices 104 are inserted directly into the storage bays 105 and do not require a separate carriage or tray as in many existing storage server configurations. Accordingly, the storage devices 104 can be tightly spaced together in storage server chassis 102.

Although the storage server chassis shown in the figures is configured to house fifteen storage devices, other configurations are possible with more or fewer storage devices and ancillary assemblies, such as carrier assembly 110. Furthermore, although the storage server chassis shown in the figures is configured to house 3.5" hard drives, other storage devices, components, and/or devices can be housed and cooled using the disclosed technology.

Figure 2:
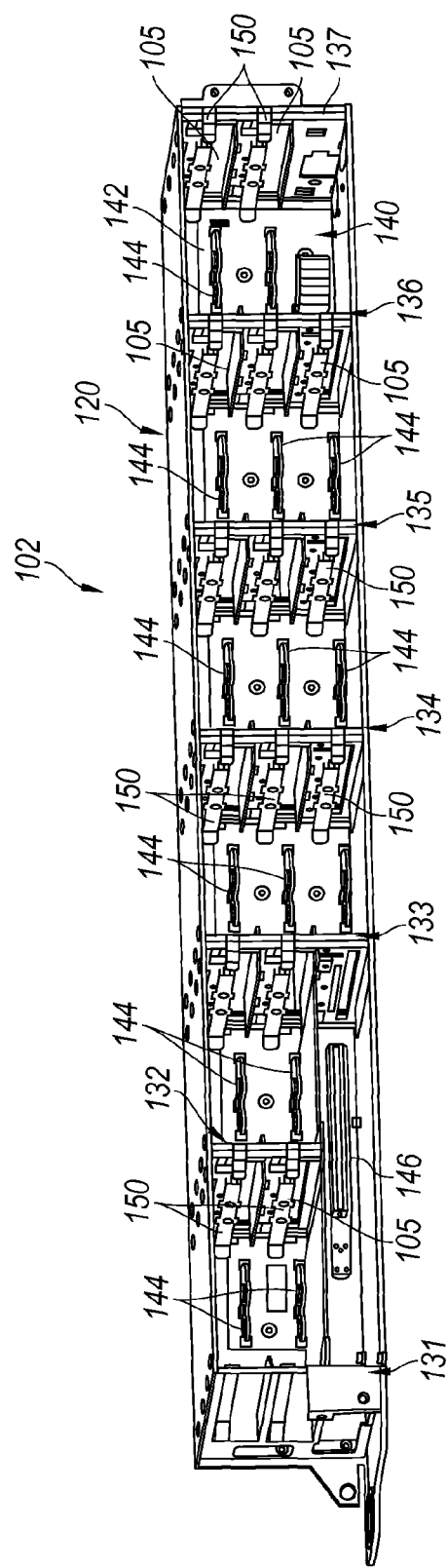
FIG. 2 is a perspective view of the high-density storage server chassis shown in FIG. 1.

With further reference to FIG. 2, storage server chassis 102 includes a longitudinally extending frame 120 with a plurality of partitions 131-137 mounted transversely to the frame 120 in spaced apart relation to define at least one storage bay 105 between adjacent ones of the partitions. In the illustrated embodiment, the frame is configured with a plurality of storage bays 105 between adjacent partitions. Storage server chassis 102 also includes a retainer 150 corresponding to each storage bay 105. Retainer 150 is operable to retain each storage device 104 (see FIG. 1) in its corresponding storage bay. Storage server chassis 102 also includes a back plane, also referred to herein as a drive plane 140. Drive plane 140 includes a printed circuit board 142 upon which are mounted various connectors. For example, printed circuit board 142 includes a drive connector 144 corresponding to each storage bay 105. Accordingly, each storage device 104 (see FIG. 1) can interface with the printed circuit board 142 via a corresponding drive connector 144. Drive plane 140 can also include a carrier assembly connector 146 for interfacing with the carrier assembly 110 (see FIG. 1). In other embodiments, the drive plane 140 can include other suitable connectors and/or connections for connecting additional devices and/or interfacing the storage server chassis 102 to a storage server system.

Figure 3:
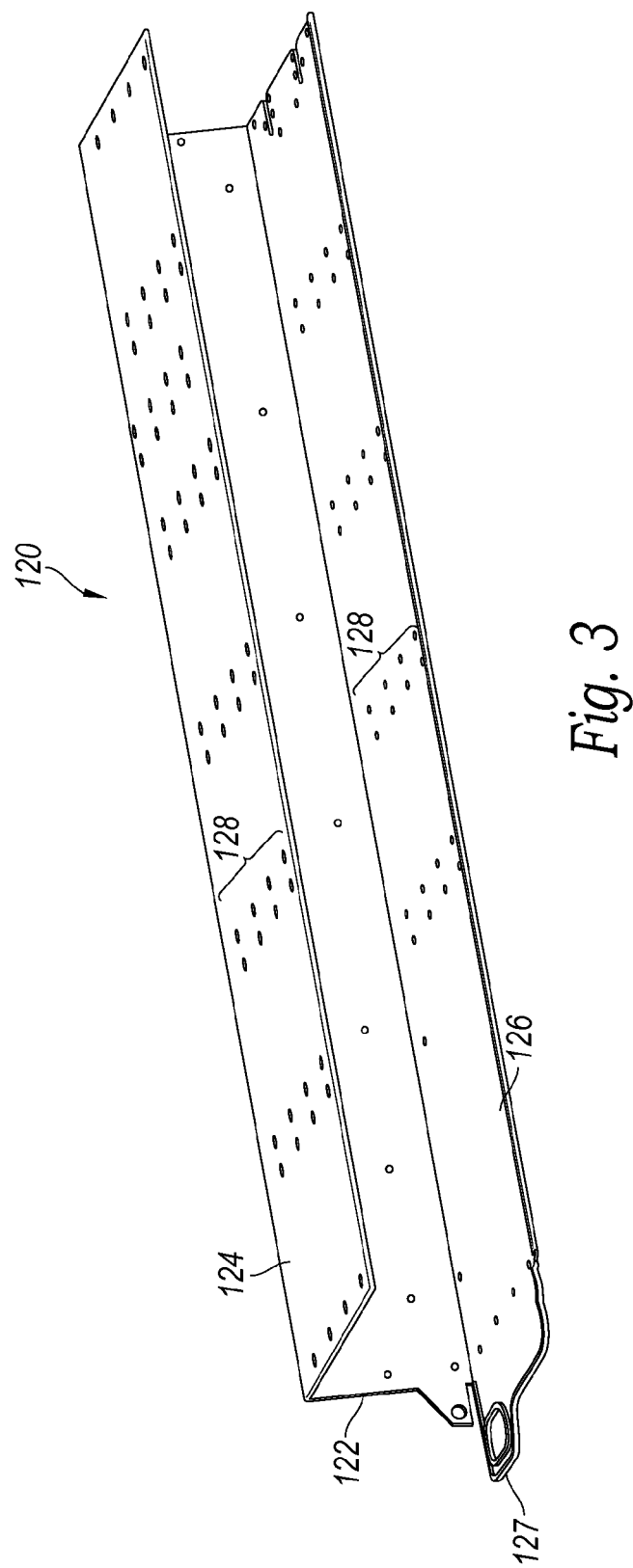
FIG. 3 is a perspective view of the storage server chassis frame shown in FIGS. 1 and 2.

Referring to FIG. 3, frame 120 includes a back wall 122, a top wall 124, and a bottom wall 126. In some embodiments, frame 120 includes a handle 127 such as that shown integrally formed with bottom wall 126. In this embodiment, frame 120 includes a plurality of various mounting holes such as mounting holes 128 for mounting the partitions, the drive plane board, and other components. In some embodiments, frame 120 is formed from sheet metal. Although frame 120 is shown and described herein as an elongate channel shaped member, other frame configurations for mounting and supporting the partitions are possible.

Figure 4:
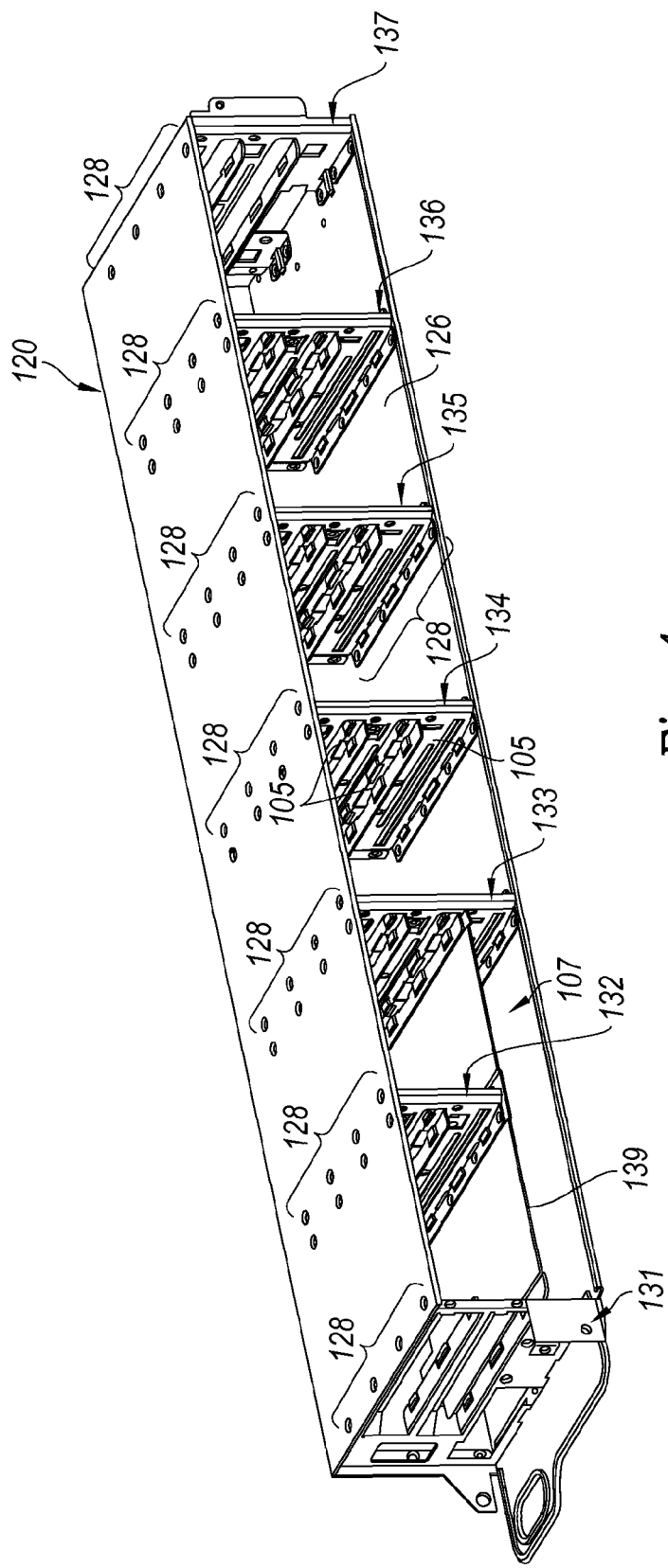
FIG. 4 is a perspective view of the storage server chassis frame and partitions.

As shown in FIG. 4, partitions 131 and 133-137 are mounted to the top wall 124 and bottom wall 126 of the frame 120. The partitions are secured to frame 120 with suitable fasteners (not shown) extending into mounting holes 128. Partition 132 is mounted to the top wall 124 and spacer panel 139 which extends between partitions 131 and 133 to provide a large storage bay 107 for carrier assembly 110 (FIG. 1). Partitions 133-136 are of similar construction, and opposed pairs of the partitions define three storage bays 105 therebetween.

In some embodiments, the partitions have varying configurations. For example, end wall partitions 131 and 137 can include specific features for mounting additional components. In this embodiment, the partition 131 includes features to mount the latch assembly 112 and partition 137 includes features to mount the fan assembly 106 (see FIG. 1). Partition 132 is configured to support two storage devices on either side rather than three. Similarly, end wall 137 is configured to support two storage devices above the power connector 108 (see FIG. 1).

Figure 5:
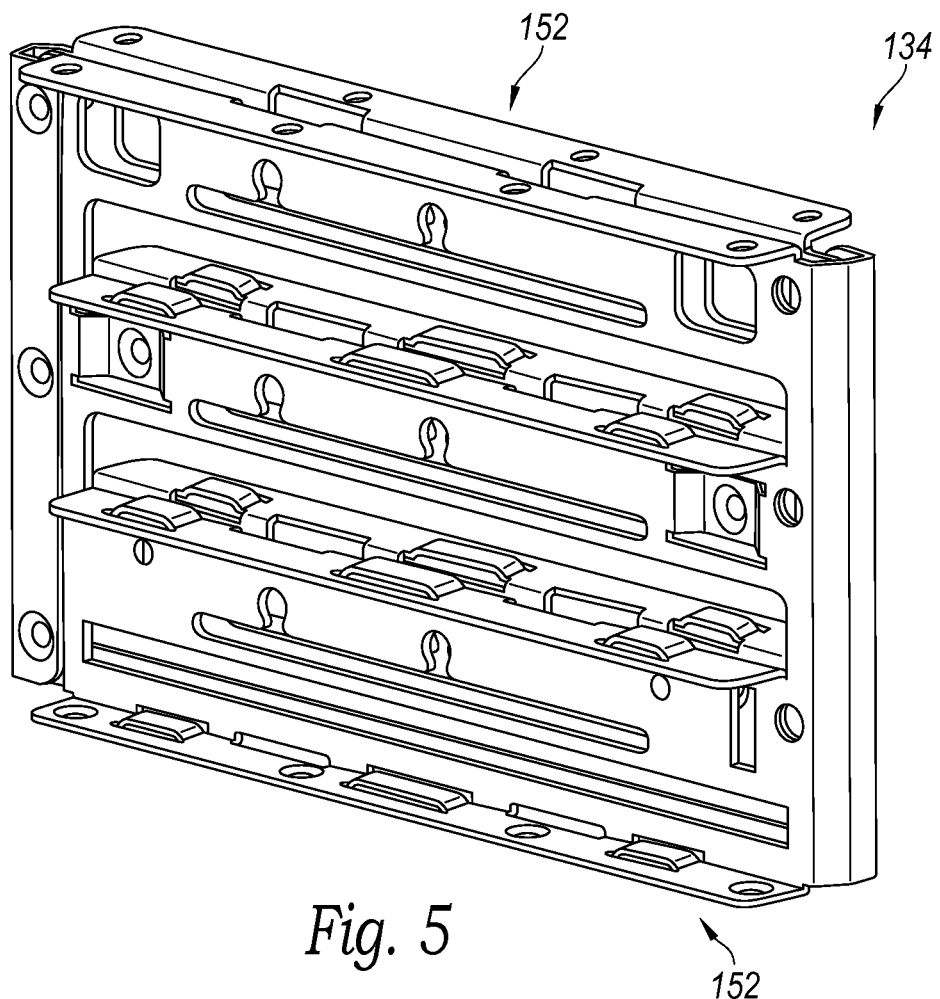
FIG. 5 is a perspective view of a partition according to a representative embodiment.
Figure 6A:
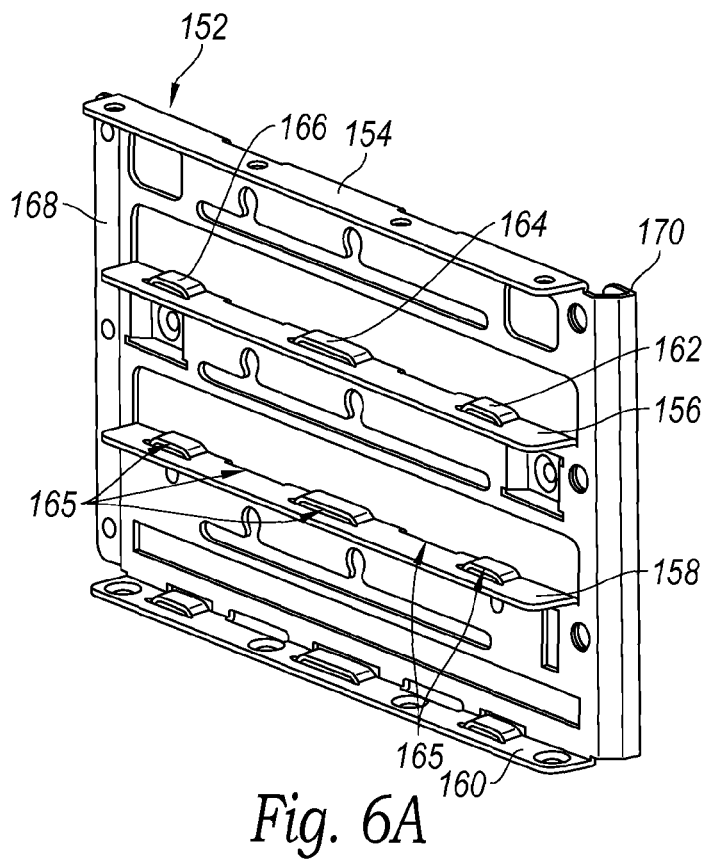
FIG. 6A is a perspective view of a partition wall as viewed from the front.
Figure 6B:
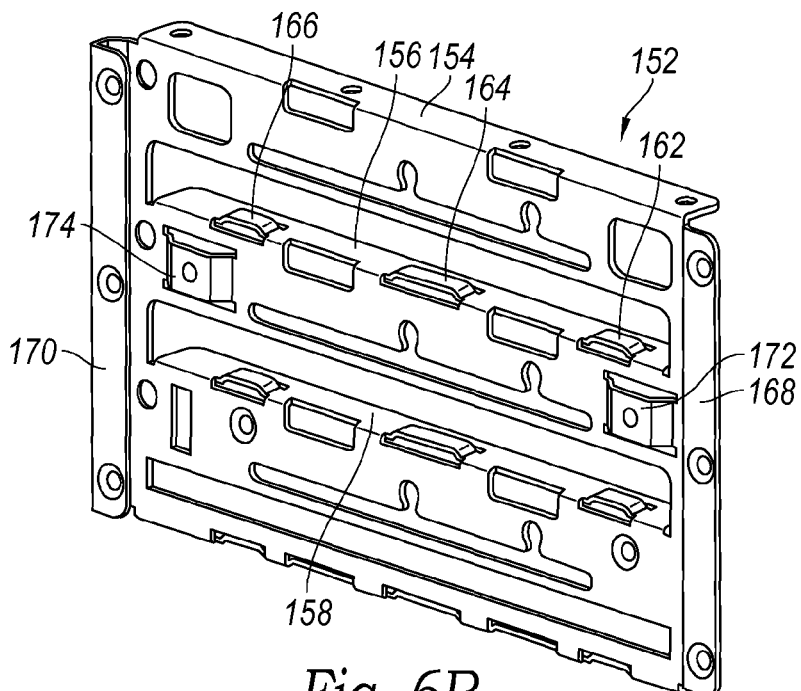
FIG. 6B is a perspective view of a partition wall as viewed from the back.

FIG. 5 illustrates partition 134 as a representative construction of the partitions 132-136. It can be appreciated from the figure that partition 134 is comprised of a pair of partition walls 152 that are fastened together. In this embodiment, partition walls 152 are identical and reversible. With further reference to FIGS. 6A and 6B, partition wall 152 includes a top mounting flange 154 and a bottom mounting flange 160. These flanges confront the top wall 124 and bottom wall 126 of frame 120, respectively. Partition wall 152 also includes a front connector flange 170 and a rear connector flange 168. As mentioned above, partition wall 152 is reversible such that the connector flange 170 of a first partition wall 152 can be connected to a connector flange 168 of a second partition wall 152. Partition wall 152 also includes a pair of bridge lances 172 and 174 which provide additional connection points when two partition walls 152 are secured to each other.

Each partition wall 152 includes a plurality of ledges 156, 158, and 160. Opposed pairs of these support ledges (156, 158, 160) extend into a corresponding storage bay 105 for supporting a storage device 104 (see e.g., FIG. 1). It should be appreciated that bottom mounting flange 160 also doubles as a support ledge. Each support ledge 156, 158, and 160 includes a plurality of protrusions 162, 164, and 166 that are positioned to support bottom edge portions of the storage devices (FIG. 1), thereby spacing the storage devices away from the support ledge and defining air flow regions 165 between the storage device and the support ledge (156, 158, 160). In this way, the high-density storage server chassis disclosed herein provides high-density storage of storage devices while still providing air flow between the storage devices for adequate cooling.

In some embodiments, opposed pairs of support ledges (e.g., support ledge 156) include three pairs of protrusions. A first pair of protrusions 162 facilitate proper insertion of the storage device into the frame. A second pair of protrusions 164 are positioned to support the storage device, and a third pair of protrusions 166 are positioned to locate the storage device relative to a corresponding drive connector 144.

In some embodiments, the partition wall 152 is comprised of stamped and bent sheet metal. Thus, in some embodiments, the protrusions 162, 164, and 166 are in the form of bridge lances (162, 164, 166) stamped into the support ledge (156, 158, 160). While protrusions 162, 164, and 166 are described herein as three separate protrusions, in other embodiments, the support ledges may include more or fewer protrusions to support and locate the storage devices. For example, a single elongated bride lance may be formed in a corresponding support ledge to support and configured to guide the respective storage device and maintain air flow regions between and/or around the storage device. In some embodiments, the protrusions can be dimples or other suitable protrusions formed in the support ledges. In still other embodiments, the protrusions may be separate components that are attached to a support ledge. For example, plastic components may be snapped or otherwise secured to the ledge. In some embodiments, the partition, ledges, and protrusions are integrally formed such as by sheet metal fabrication techniques including stamping and bending. In other embodiments, the partitions, ledges, and protrusions may be integrally molded from plastic. While the partitions are shown and described herein as being two partition walls joined together, the partitions may be a single wall with support ledges extending on either side.

FIGS. 7A-7C illustrate a retainer 150 according to a representative embodiment. Retainer 150 includes an elongate arm 180 that includes first and second end portions 182 and 184, respectively. A latch 186 is disposed on the first end portion and a hook 188 is disposed in the second end portion. The arm 180 extends along a corresponding partition and is movable relative to the partition between an open position and a closed position. The latch 186 is configured to engage the partition and retain a corresponding storage device in its corresponding storage bay when the retainer is in the closed position. The hook 188 is positioned to pull the corresponding storage device from its corresponding storage bay when the latch 186 is disengaged and the retainer 150 is moved from the closed position to the open position.

Retainer 150 also includes a pair of pins 192 extending from the arm 180 for slideably attaching the retainer 150 to the partition. As shown in FIG. 7C, pins 192 include a neck portion 193 and a head 195. Latch 186 includes a latch pin 194 configured to engage the partition and retain a storage device in its corresponding storage bay. Latch 186 extends from arm 180 at a bend 197 thereby providing a spring bias towards the partition to releasably engage latch pin 194 with a feature, such as an aperture or receptacle, on the partition. Latch 186 also includes a foot 196 which abuts a front face of the storage device to help retain the storage device in its corresponding storage bay. Latch 186 also includes loop 198 to facilitate disengagement of latch pin 194 and removal of the storage device.

Figure 8:
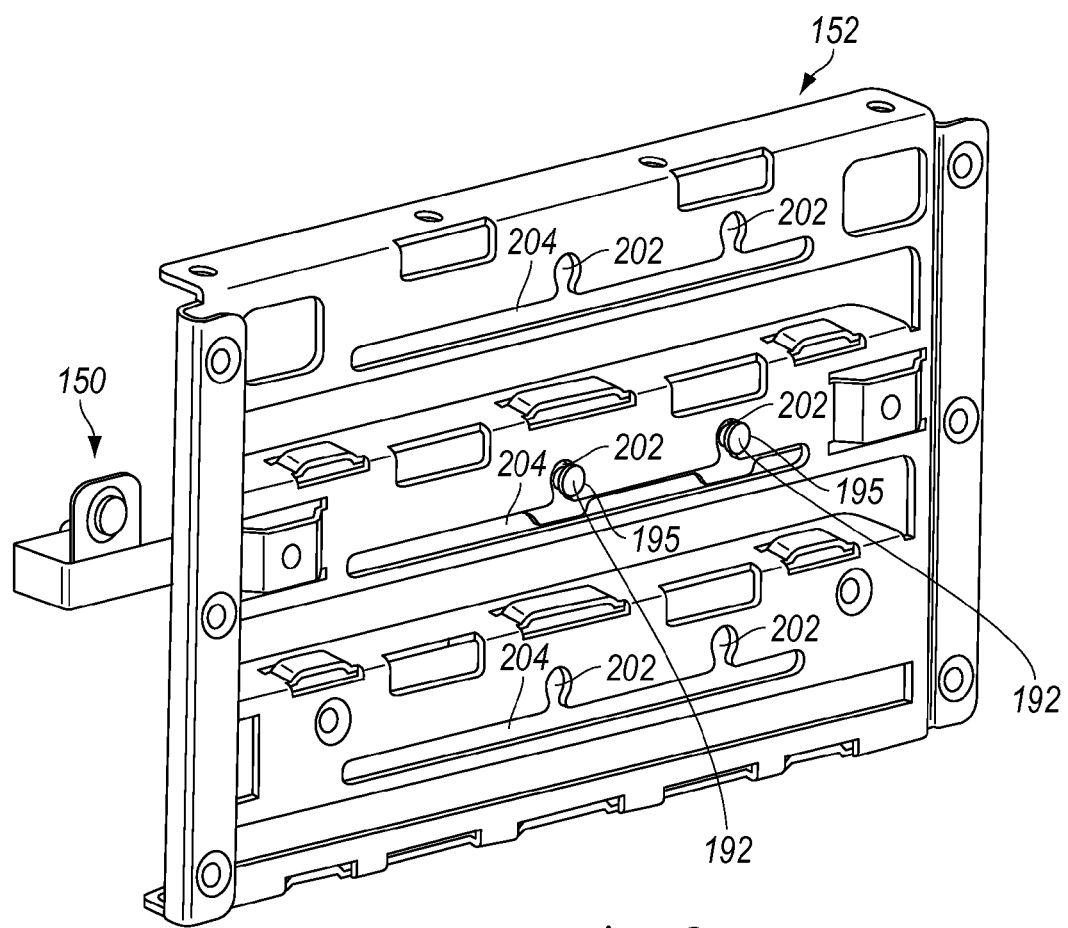
FIG. 8 is a perspective view illustrating the installation of a retainer on a corresponding partition wall.

As shown in FIG. 8, partition wall 152 includes an elongate slot 204 corresponding to each storage bay. Retainer 150 is movably or slideably attached to the partition along slot 204. The retainer 150 is installed in slot 204 through apertures 202 which intersects slot 204. The pins 192 are installed through apertures 202 and are then moved downwardly into slot 204 where they are slideably engaged with the slot 204. It should be appreciated that pins 192 are captured in slot 204 because slot 204 has a narrower width than the head 195 of pin 192.

Figure 9A:
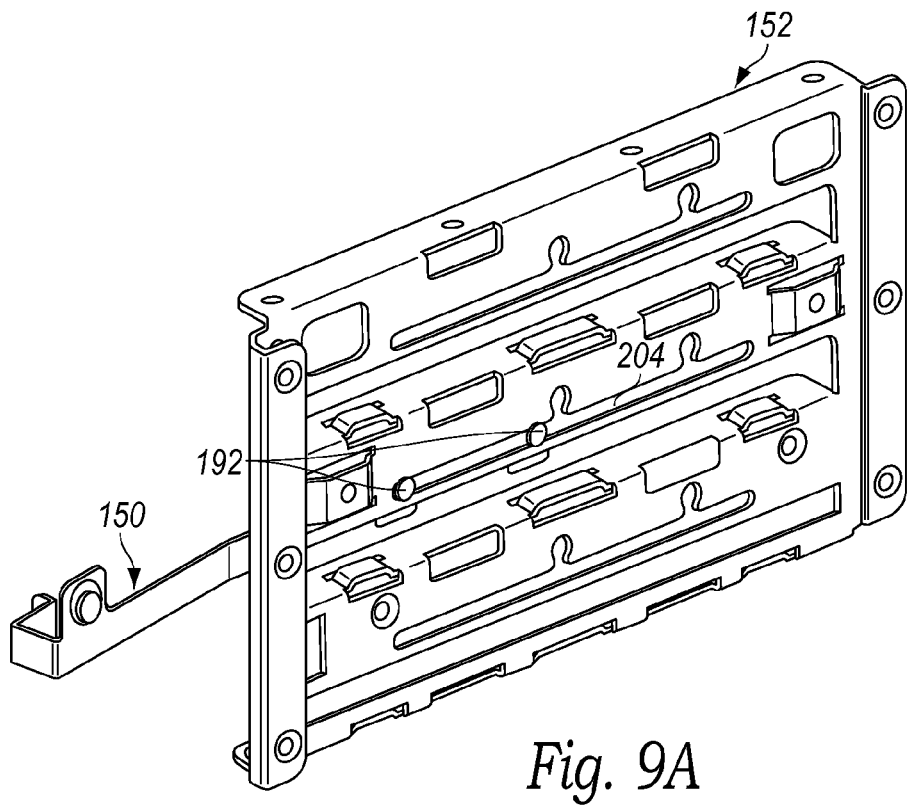
FIG. 9A is a perspective view illustrating the retainer in an open position.
Figure 9B:
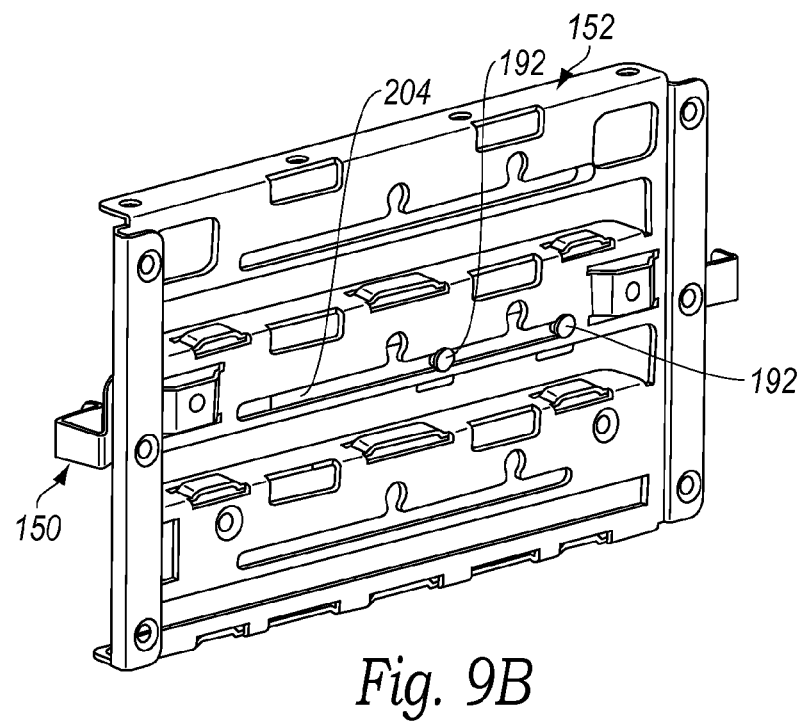
FIG. 9B is a perspective view illustrating the retainer in a closed position.
Figure 10A:
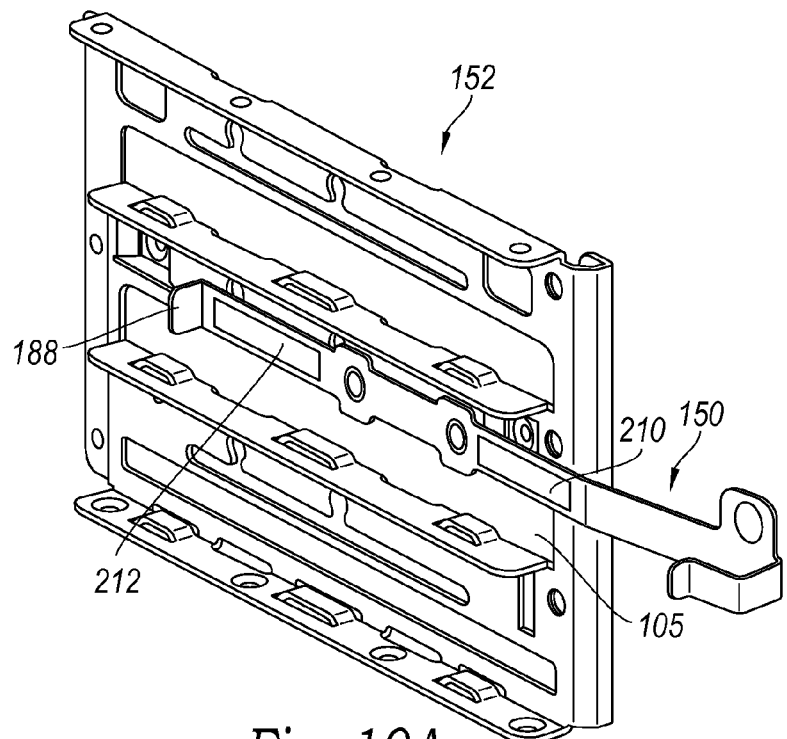
FIG. 10A is a perspective view of a partition wall and retainer as viewed from the front illustrating the retainer in the open position.
Figure 10B:
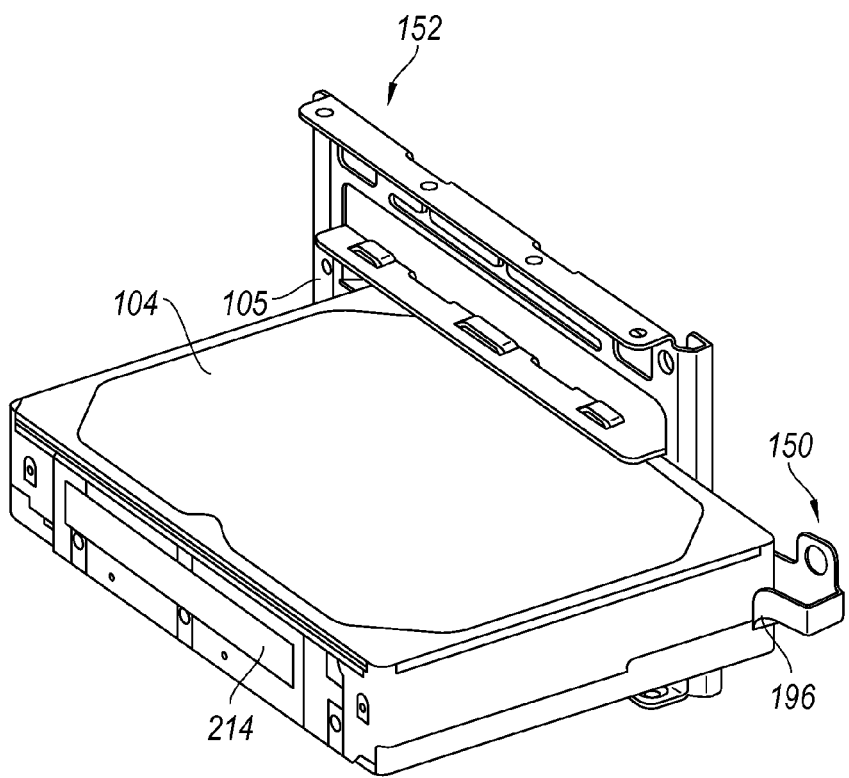
FIG. 10B is a perspective view illustrating the insertion of a storage device into the corresponding storage bay.

As shown in FIGS. 9A and 9B, the retainer 150 slideably engages slot 204 and is moveable between an open position shown in FIG. 9A and a closed position shown in FIG. 9B. FIGS. 10A and 10B illustrate installation of a storage device 104 into a corresponding storage bay 105. In FIG. 10A, retainer 150 is shown in the open position and ready to accept a storage device 104. FIG. 10B illustrates the positioning of a storage device 104 into storage bay 105 and against retainer 150. Latch foot 196 confronts the front of storage device 104 to help retain it in the storage bay.

In various embodiments, the retainer 150 can include one or more rubber or plastic strips 210, 212 to help retain the storage device 104 in the storage bay. In some embodiments, a similar piece of material can be applied to the storage device 104, such as strip 214 shown in FIG. 10B. In some embodiments, the strips can comprise a self-adhesive rubber or plastic material having a thickness of approximately 0.5 mm, for example.

Figure 11:
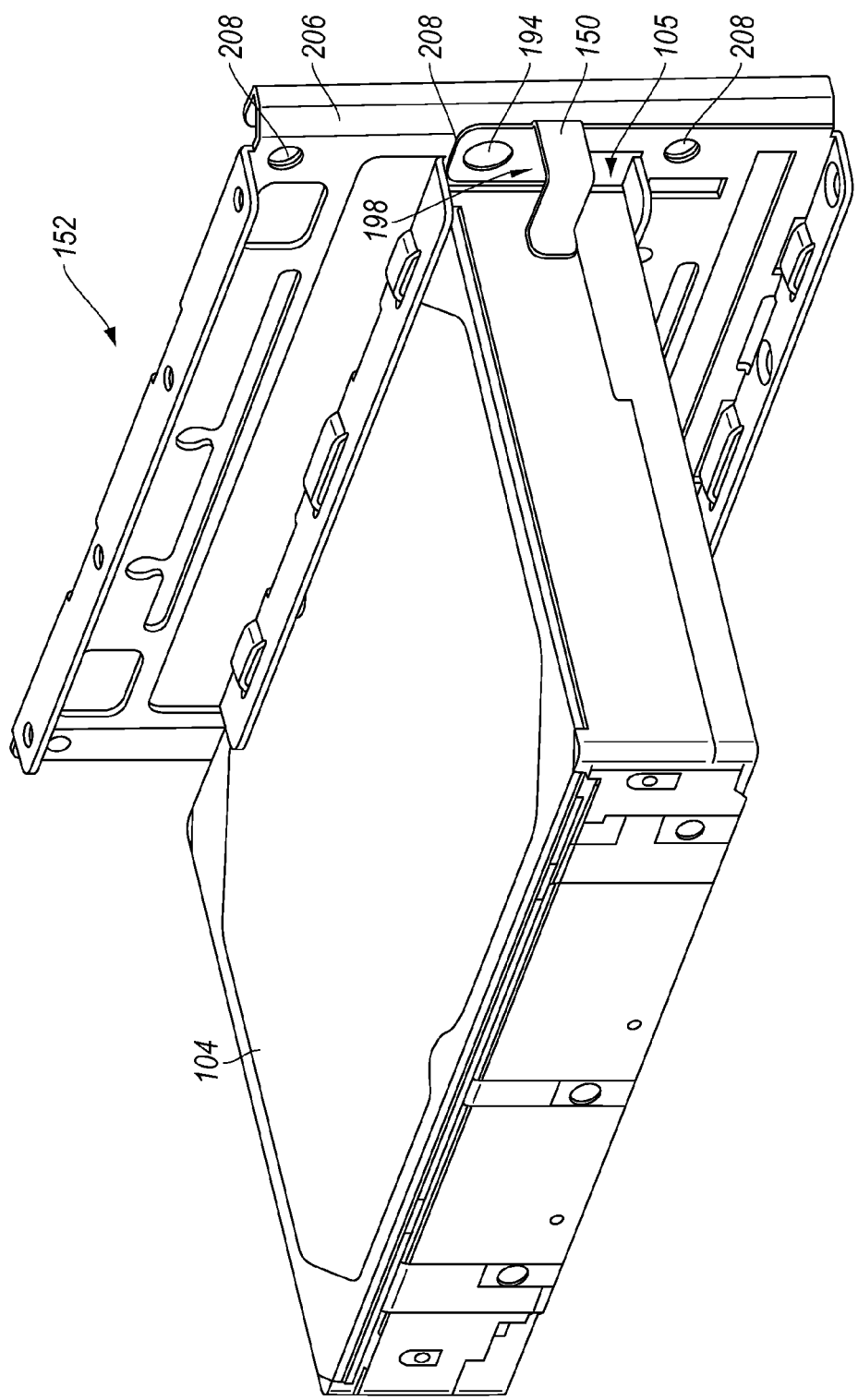
FIG. 11 is a perspective view illustrating the storage device installed into its corresponding bay and the retainer in a closed latched position.

Referring to FIG. 11, once the storage device 104 and retainer 150 are moved to the closed position, latch pin 194 engages a mating feature in the partition wall 152. In some embodiments, the mating features are apertures 208 sized and configured to receive the latch pin 194 therein. Partition wall 152 also includes a ramped surface 206 to facilitate directing latch pin 194 into position for engagement with the corresponding latch aperture 208. To remove the storage device 104, the loop 198 is pulled away from partition wall 152 thereby disengaging latch pin 194 from aperture 208. Subsequently, the retainer 150 and storage device 104 can be pulled toward the open position. Hook 188 (see e.g., FIG. 10A) confronts the end of the storage device 104 to pull the storage device 104 out of storage bay 105 as the retainer 150 is moved to the open position.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A storage server chassis for supporting one or more storage devices, comprising:
   a frame;
   a plurality of partitions mounted to the frame;

at least one opposed pair of support ledges disposed on corresponding partitions and positioned to support a storage device therebetween;

wherein selected support ledges include at least one protrusion positioned to space the storage device away from a portion of the support ledge thereby defining an air flow region between the storage device and the support ledge; and at least one retainer moveably attached to a corresponding partition and operative to retain a corresponding storage device in the frame, wherein the retainer is movable relative to the corresponding partition between an open position and a closed position.

2. The storage server chassis of claim 1, wherein the at least one protrusion is a bridge lance.

3. The storage server chassis of claim 1, wherein selected support ledges include three protrusions.

4. The storage server chassis of claim 1, wherein selected opposed pairs of support ledges include:
   a first pair of protrusions positioned to facilitate proper insertion of the storage device into the frame;
   a second pair of protrusions positioned to support the storage device; and
   a third pair of protrusions positioned to locate the storage device relative to a corresponding drive connector.

5. The storage server chassis of claim 1, wherein the at least one retainer includes:
   an arm extending along the corresponding partition and including first and second end portions;
   a latch disposed on the first end portion configured to engage the partition and retain a corresponding storage device in the frame when the retainer is in the closed position; and
   a hook disposed on the second end portion and positioned to pull the corresponding storage device from the frame when the latch is disengaged and the retainer is moved from the closed position to the open position.

6. The storage server chassis of claim 5, wherein the retainer further comprises at least one pin slideably engaged with a mating slot formed in the corresponding partition.

7. A storage server chassis for supporting one or more storage devices, comprising:
   a longitudinally extending frame;
   a plurality of partitions mounted transversely to the frame in spaced apart relation to define at least one storage bay between adjacent ones of the partitions;
   at least one opposed pair of support ledges disposed on the adjacent ones of the partitions and extending into a corresponding storage bay for supporting a storage device in the corresponding storage bay, wherein selected opposed pairs of support ledges each include at least one protrusion positioned to space the storage device away from a portion of the support ledge thereby defining an air flow region between the storage device and the support ledge; and
   at least one retainer moveably attached to a corresponding partition and including:
      an elongate arm extending along the corresponding partition;
      a latch disposed on the arm and configured to engage the partition and retain the storage device in its corresponding storage bay when the retainer is in a closed position; and
      a hook disposed on the arm and positioned to pull the storage device from its corresponding storage bay when the latch is disengaged and the retainer is moved from the closed position to an open position.

8. The storage server chassis of claim 7, wherein each partition comprises first and second walls.

9. The storage server chassis of claim 7, wherein the at least one opposed pair of support ledges are each comprised of sheet metal and the at least one protrusion is a bridge lance.

10. The storage server chassis of claim 7, wherein the latch includes a latch pin sized and positioned to engage a mating feature formed in the partition when the retainer is in the closed position.

11. The storage server chassis of claim 10, wherein the partition includes a ramped surface adjacent the mating feature to facilitate engagement of the latch pin with the mating feature.

12. A storage server chassis for supporting one or more storage devices, comprising:
   a longitudinally extending frame;
   a drive plane mounted in the frame and including a plurality of drive connectors;
   a plurality of partitions mounted transversely to the frame in spaced apart relation to define at least two storage bays between adjacent ones of the partitions;
   at least two opposed pairs of support ledges disposed on the partitions and extending into a corresponding storage bay for supporting a storage device in the corresponding storage bay, wherein each opposed pair of support ledges includes a pair of protrusions positioned to locate the storage device relative to a corresponding drive connector and space the storage device away from a portion of the support ledge thereby defining one or more air flow regions between the storage device and the support ledge; and
   at least one retainer moveably attached to a corresponding partition and operative to retain a corresponding storage device in its corresponding storage bay, wherein the retainer is movable between an open position and a closed position.

13. The storage server chassis of claim 12, wherein each opposed pair of support ledges includes a second pair of protrusions positioned to facilitate proper insertion of the storage device into its corresponding storage bay.

14. The storage server chassis of claim 12, further comprising a fan assembly mountable to the chassis and operative to draw air through the air flow regions.

15. The storage server chassis of claim 12, wherein the retainer further comprises at least one pin slideably engaged with a mating slot formed in the corresponding partition.

16. The storage server chassis of claim 12, wherein the at least one retainer includes:
   an arm extending along the corresponding partition and including first and second end portions;
   a latch disposed on the first end portion configured to engage the partition and retain a corresponding storage device in its corresponding storage bay when the retainer is in the closed position; and
   a hook disposed on the second end portion and positioned to pull the corresponding storage device from its corresponding storage bay when the latch is disengaged and the retainer is moved from the closed position to the open position.

17. The storage server chassis of claim 16, wherein the latch includes a latch pin sized and positioned to engage a mating feature formed in the partition when the retainer is in the closed position.

18. The storage server chassis of claim 16, wherein the latch is biased toward the partition and the mating feature.

19. A storage server chassis for supporting one or more storage devices, comprising:
  a frame; and
  at least one opposed pair of support ledges disposed in the frame and positioned to support a storage device therebetween;
  wherein selected support ledges include at least one bridge lance positioned to space the storage device away from a portion of the support ledge thereby defining an air flow region between the storage device and the support ledge.

* * * * *